United States Patent [19]
Cunningham et al.

[11] Patent Number: 5,735,950
[45] Date of Patent: Apr. 7, 1998

[54] METHOD FOR PRODUCING A PRECISE ALLOY COMPOSITION FROM INPUT VARIABLES UNDER NONLINEAR INCORPORATION CONDITIONS

[75] Inventors: John Edward Cunningham, Lincroft; Keith Wayne Goossen, Aberdeen, both of N.J.

[73] Assignee: Lucent Technologies Inc., Murray Hill, N.J.

[21] Appl. No.: 653,086

[22] Filed: May 24, 1996

Related U.S. Application Data

[63] Continuation of Ser. No. 395,271, Feb. 27, 1995, abandoned, which is a continuation of Ser. No. 119,685, Sep. 13, 1993, abandoned.

[51] Int. Cl.[6] .................................................. C30B 25/16
[52] U.S. Cl. ............................. 117/85; 117/953; 437/107
[58] Field of Search ...................... 117/83, 953; 437/107

[56] References Cited

U.S. PATENT DOCUMENTS

| | | | |
|---|---|---|---|
| 4,072,544 | 2/1978 | DeWinter et al. | 437/120 |
| 5,096,533 | 3/1992 | Igarashi | 437/107 |
| 5,171,399 | 12/1992 | Brennan et al. | 156/601 |
| 5,231,298 | 7/1993 | Daly | 257/191 |
| 5,274,251 | 12/1993 | Ota et al. | 257/78 |

OTHER PUBLICATIONS

L. Samuelson et al., "Organometallic Epitaxial Growth of $GaAs_{1-x}P_x$," Journal de Physique, Colloque C5, supplément au n° 12, Tome 43, décembre 1982, pp. C5-323 to C5-338.

G.B. Stringfellow, *Organometallic Vapor–Phase Epitaxy: Theory and Practice* Academic Press, Inc., San Diego, CA (1989), pp. 114–126.

*Primary Examiner*—Robert Kunemund

[57] ABSTRACT

A process for manufacturing precise alloy compositions in nonlinear alloy systems. The invention implements a new quadratic fitting function that relates alloy composition $c_A$ for a variable A to input fluxes $f_A$ and $f_B$, as $c_A = f_A^2/(f_A^2 + \beta f_B^2)$. $\beta$ is a parameter that is used to modify the incorporation of the Group V input variable B. This modification is necessary because of different surface populations of Group V dimer species. This new fitting function precisely predicts alloy compositions in nonlinear systems, such as the $GaAs_{1-y}P_y$ system, where y is set equal to the composition $c_A$.

12 Claims, 5 Drawing Sheets

METHOD FOR PRODUCING A PRECISE ALLOY COMPOSITION FROM INPUT VARIABLES UNDER NONLINEAR INCORPORATION CONDITIONS

This is a Continuation of Application Ser. No. 08/395,271 filed Feb. 27, 1995, now abandoned, which in turn is a Continuation of Application Ser. No. 08/119,685, filed Sep. 13, 1993, now abandoned.

BACKGROUND OF THE INVENTION

1. Field of the Invention

The present invention relates generally to the field of semiconductors, and more particularly, to a method for producing a precise alloy composition from input variables under nonlinear incorporation conditions.

2. Related Art

In order to manufacture binary or ternary alloy compositions, practitioners consult metallurgy tables to determine the proportions of the constituent elements. A typical metallurgy table will indicate the number of moles of the constituent elements (also called input variables) required to produce the desired alloy composition. For a binary alloy composition having 50% of each input variable, the metallurgy table may indicate an equal number of moles for each. Processes in which the input variables are added in amounts that are equal in percentage to the amount of those input variables in the resulting alloy composition are called linear incorporations. These linear incorporations have been characterized for many decades according to a theorem called Vegard's law.

Vegard's law is a well known relationship governing solid state compositions. For a binary alloy AB, where the composition of variable A is $c_A$ and the composition of variable B is $c_B$, Vegard's law simply describes the composition for variable A as: $c_A = f_A/(f_A + f_B)$. Here, $f_A$ and $f_B$ represent the input fluxes of the input variables A and B (e.g., the number of moles of the constituent elements A and B). The composition for variable B is thus expressed as: $c_B = 1 - c_A$. A graphical plot of an input fluxes $f_A$ or $f_B$ versus the alloy composition yields a linear relationship. Not all alloys, however, adhere to this linear relationship. Several Group III-V alloy systems are known to have a nonlinear relationship, particularly the ternary and quaternary alloys such as GaAsP, InAsP, InGaAsP, GaAsSb, InAsSb, GaInAsSb.

To date, the composition of alloys which follow nonlinear incorporations (i.e., those that do not follow Vegard's law) has been unpredictable. The ability to even roughly predict the alloy composition based on the amounts of input variables, or the ability to predict the amounts of input variables based on the alloy composition, has not existed.

As a result, Group III-V alloys are generally produced through an iterative, impractical process. Such techniques produce very low yield, and thus, are not cost effective. Many iterations of the manufacturing and testing cycle are required to produce devices possessing the desired electrical or optical characteristics (e.g., bandgap). Accordingly, much raw material in the form of wafers, or the like, is wasted because of these iterations. This is adversely compounded by the fact that such material is significantly more expensive than more conventional semiconductor materials such as alloys based on the Group III sublattice, Si or Ge.

Nonlinearities are problematic because many photoelectric emitter and detector applications that are under development require changing the bandgap, and thus the operational wavelength of the device, by adjusting the alloy composition. The inherent nonlinearity of such alloy compositions precludes use of certain alloys in applications requiring a narrow operating wavelength, because they cannot be manufactured with a high yield. Therefore, what is needed is a process for producing a precise alloy composition from input variables under nonlinear incorporation conditions.

SUMMARY OF THE INVENTION

The invention is directed to a process for manufacturing precise alloy compositions in nonlinear alloy systems. The invention implements a new fitting function to replace Vegard's law. The new fitting function of the invention is quadratic. This new fitting function relates alloy composition for variable A to the input fluxes $f_A$ and $f_B$, as $c_A = f_A^2/(f_A^2 + \beta f_B^2)$. $\beta$ is a parameter that is used to modify the incorporation of the Group V input variable B. This modification is necessary because of different surface populations of Group V dimer species. This new fitting function precisely predicts alloy compositions in nonlinear systems, such as the $GaAs_{1-y}P_y$ system, where y is set equal to the composition $c_A$, $f_A$ refers to P flux and $f_B$ refers to As flux.

According to the present invention, the nonlinear incorporation process in alloy systems can be corrected by use of a quadratic combination of the input variables. The desired operational characteristics of a device to be produced must first be identified. This identification process typically includes determining the bandgap of the alloy from which the device will be manufactured. Using the desired bandgap of the alloy, a corresponding composition for the alloy can be determined according to known techniques. Once this alloy composition is known, the new fitting function is used to determine the quadratic combination of the input variables for fabrication of the desired alloy composition. An alloy composition produced in this manner will have the desired bandgap. Because of the nonlinearity described above, this result could not be achieved using conventional bandgap engineering techniques.

Many other alloy compositions may also contain this nonlinearity, but to a lesser extent. The Group III alloys in III-V compounds and Group IV alloys are examples of alloys in which the nonlinearity is small. The inventors' new fitting function can thus be used together with Vegard's law for producing higher precision for linear alloy compositions than is otherwise obtained using Vegard's law alone.

BRIEF DESCRIPTION OF THE FIGURES

The invention will be better understood if reference is made to the accompanying drawings in which.

DETAILED DESCRIPTION OF THE PREFERRED EMBODIMENTS

The preferred embodiment of the invention is discussed in detail below. While specific steps, configurations and arrangements are discussed, it should be understood that this is done for illustration purposes only. A person skilled in the relevant art will recognize that other steps, configurations and arrangements may be used without departing from the spirit and scope of the invention.

Further, background material concerning semiconductor solid state physics may be found in a number of references, including two books by S. M. Sze, titled: *Physics of Semiconductor Devices*, John Wiley & Sons, Inc., New York, (1981), and *Semiconductor Devices, Physics and Technology*, John Wiley & Sons, Inc., New York, (1985), both of which are incorporated herein by reference.

The preferred embodiment of the invention is now described with reference to the figures where like reference numbers indicate identical or functionally similar features. Also in the figures, the left most digit of each reference number corresponds to the figure in which the reference number is first used.

New Fitting Functions

The preferred embodiment of the invention will be described using P incorporation into $GaAs_{1-y}P_y$ alloys. Specifically, the inventors have found that deviations from Vegard's law are severe for such alloys which are strained, but can now be accurately predicted with a new fitting function according to the present invention. This new fitting function relates alloy composition for variable A to input fluxes $f_A$ and $f_B$, as $c_A = f_A^2/(f_A^2 + \beta f_B^2)$.

Such strained alloys are of paramount technical importance in the fabrication of multiple quantum wells (MQW's). MQWs have a periodic sequence of layers of material of wide bandgap and narrow bandgap material. To achieve some property such as a specific operating wavelength, one of the materials in the MQW has a lattice constant different than the substrate. The inventors have determined (see J. E. Cunningham, K. W. Coossen, M. Williams and W. Y. Jan, *Appl. Phys. Lett.* 60, 727, 1992) that differences in strain can be balanced so that the MQW remains defect free. This is achieved by making the lattice constant of the other MQW material different than the lattice constant of the substrate, and of opposite strain type as the first material (i.e., tensile rather than compressive, or vice versa). Without such engineering, the MQW becomes defected, degrading performance. Of course, the invention can be used to produce many other alloy compositions, and thus, should not be limited to the described examples.

According to the present invention, the nonlinear incorporation process in alloy systems can be corrected by use of a quadratic combination of the flux variables using the new fitting function according to the present invention. Implementation of the new fitting function is as follows.

The desired operational characteristics of a device to be produced must first be identified. This identification process typically includes determining the bandgap of the alloy from which the device will be manufactured. Using the desired bandgap of the alloy, a corresponding composition for the alloy can be determined according to known techniques.

Once this alloy composition is known, the new fitting function according to the present invention is used to determine the quadratic combination of the input variable for fabrication of the desired alloy composition. An alloy composition produced in this manner will have the desired bandgap. Because of the nonlinearity described above, this result could not be achieved using conventional bandgap engineering techniques.

The processes which may be used to manufacture an alloy composition according to the present invention include Liquid Phase Epitaxy (LPE), Vapor Phase Epitaxy (VPE), Molecular Beam Epitaxy (MBE), Gas Source MBE, Chemical Beam Epitaxy (CBE), Chemical Vapor Deposition (CVD), Metalorganic CVD, and the like. Note that while the present description refers to atomic fluxes in the reactor, the alloy atoms may be carried in carrier molecules which deposit the alloy atoms on the growth surfaces. For example, in the growth of P, the P is carried within the reactor in molecules of $PH_3$, which impinge on the growth surface and release the P according to known principles. In this case, since there is one alloy atom per carrier molecule, the atomic and molecular fluxes are identical. However, in cases where there is more than one alloy atom per carrier molecule, the referred to atomic flux would be twice the molecular flux.

Figure 1:
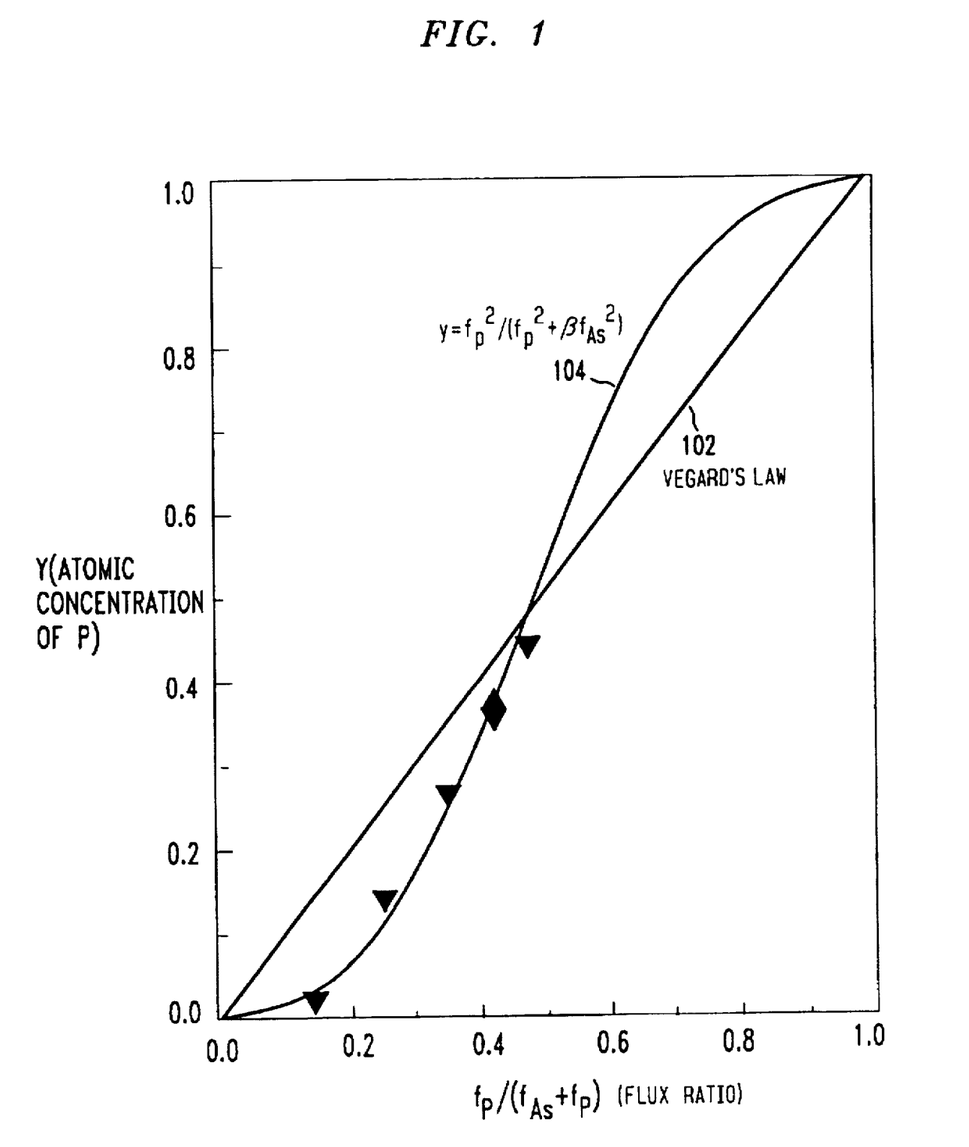
FIG. 1 shows a plot of the atomic concentration of P as a function of the relative atomic flux of P for a $GaAs_{1-y}P_y$ alloy.

The atomic concentration of P ($c_p$) as a function of the relative atomic flux of P in the reactor for a $GaAs_{1-y}P_y$ alloy is shown in FIG. 1. The concentrations are determined by a combination of Photo Luminescence (PL; shown as solid diamond data points) scattering and secondary ion milling scattering (SIMS; shown as solid inverted triangle diamond data points) measurements, which are well known to those skilled in the art. A straight line 102 shows the concentration predicted by Vegard's law (i.e., $c_p = f_p/(f_{As} + f_p)$). A curve 104 shows the concentration according to the new fitting function according to the present invention, where $c_p = f_p^2/(f_p^2 + \beta f_{As}^2)$, showing excellent agreement. Note that $c_{As}$ will equal $1-c_p$.

$\beta$ is simply an adjustable parameter, which may vary widely according to the manufacturing process employed. For a given manufacturing process, $\beta$ can be determined by using a statistical least squared analysis (minimizing chi squared ($X^2$)) to fit the curve to a few data points yielded by initial scattering measurements. For the above example alloy, $\beta$ was determined to be =0.85. The inventors have further determined that it is convenient in the case of strained materials as described above, to define use the fitting function $y = f_p^2/(f_p^2 + \Gamma u f_{As}^2)$, where $\Gamma$=is the adjustable parameter and $u = f_p/(f_{As} + f_p)$.

Finally, there may be cases where neither Vegard's law or the new function alone provides a good fit. In such cases, a formula that contains weighted components of Vegard's law and the new fitting function according to the present invention may be used.

According to the present invention, once the desired concentration of material in an alloy is selected, the necessary atomic fluxes can be determined in advance, as described above in connection with the present invention. The control of the concentration is an increasingly important issue in photonic devices such as MQW light modulators, which function in a narrow range of wavelengths at the effective bandgap of the MQW. Since this range of wavelengths needs to be precisely controlled, the concentrations need to be precisely controlled. In practice, to obtain a preferred level of performance in these devices, the concentration must be controlled to within one part in a thousand. Determining proper concentrations according to the present invention is the first demonstration of such control.

Solid State Foundation of the Invention

The following discussion sets forth the work conducted by the inventors which led to their discovery of the new fitting functions.

The inventors began by measuring nonlinear anion incorporation in GaAsP on GaAs. The nonlinear anion incorporation was observed to vary systematically with the alloy lattice constant as it changed from a relaxed layer to an elastically strained layer in a MQW structure. The inventors then precisely modeled these characteristics with an anion dimerization function that enhances the probability of As incorporation into the alloy when a match in bond length between the dimer and lattice occurs.

The inventors' investigation began as a result of the inability in the art to control composition of Group V alloys. As photonic applications for GaAsP materials widen for emitter and detector devices, the control over Group V composition becomes an increasingly important issue. For instance, in photonic switching applications, such as MQW modulators, $GaAs_{l-y}P_y$ is a tensile strained barrier that balances a compressively strained $In_xGa_{l-x}As$ layer on GaAs. Such MQW's operate within the technologically important wavelength range from about 0.86 to 1.06 μm. (See J. E. Cunningham, K. W. Coossen, M. Williams and W. Y. Jan, Appl. Phys. Letts. 60, 727, 1992.)

To avoid the formation of lattice dislocations (i.e., lattice mismatch at layer boundaries) and a catastrophic loss in MQW functionality, the Group V composition must be controlled with precision equal to that of the Group III composition. Well formed excitons in these devices require δx<0.001. However, such control over y in Group V based sublattices has yet to be demonstrated, as discussed above. (As is well known, the variables y and x are changed to vary the composition of the alloy.)

Two other considerations necessitate the capacity to predict in advance an absolute y from input flux variables for y as it ranges from 0 to 1 (i.e., y=0→1). The first is the complexity of a 2D–3D strain induced growth transition between layers in the Group V alloy system. The second is the technological need to vary barrier height and width between adjacent layers. (See I. E. Cunningham, K. W. Coossen, and W. Y. Jan, J. Crystal Growth, 127, 184, 1993.)

The constraints in the previous paragraph appear non-problematic on thermodynamic grounds. This is because binary As-P alloys exhibit nearly perfect regular solution character, and GaAsP is a compound with the lowest temperature of miscibility among III–V ternary alloys. (See J. C. Phillips, Bonds and Bands in Semiconductors, Academic Press, New York, 1973.) Unfortunately, all of the literature on GaAsP shows Group V incorporation characteristics that strongly deviate from the linear relationship predicted by Vegard's law. (See L. Samuelson, P. Oreling, H. Tize, and H. R. Grimmeiss, J. Physique, 43, C5-CC323, 1982; and T. Nomura, H Ogasawara, M. Miyao, and Hagino, J. Crystal Growth, 111, 61, 1991.) Furthermore, to achieve the desired alloy composition precision discussed above, little to no correlation among datum can be found for Group V based sublattice compositions. Because the above described strain balanced MQW provide a new strain state for GaAsP, they present a new lattice to study anion incorporation.

Here, the inventors present measurements of Group V solid state incorporation into GaAsP using High Resolution X-Ray diffraction (HRXRD), Secondary Ion Mass Spectrometry (SIMS) and low temperature photoluminescence.

The inventors grew ternary layers by Gas Source Molecular Beam Epitaxy (also called "gas source MBE") using cracked $AsH_3$ and $PH_3$ and deposited GaAsP at a low substrate temperature of about 470° C. Because the hydride cracker which was employed principally produced monomer output species, incorporation of the Group V elements into GaAsP is simpler than for non-monomeristic cases, such as those addressed by J. R. Arthur and J. L. Lepore, J. Vac. Sci. Technol., 6545 (1969), and C. H. Chen, D. S. Cao; and C. T. Foxon, B. A. Joyce and M. T. Norris, J. Crystal Growth, 49, 132, 1981.

In addition, the inventors carefully examined incorporation of Group V elements into alloys near y=0 and y=1.0; two alloy regions that have previously been ignored. Their resulting data can be organized into distinct incorporation regimes that correspond to a lattice that is either incoherently relaxed or elasticity strained. More importantly, they have invented how to precisely predict y composition from known amounts of input variables when incorporation is viewed in two new ways: 1) anion species dimerize on the surface and 2) a match in bond length between dimer and alloy develops to facilitate attachment into the lattice.

Specifically, the inventors grew ternary layers of $GaAs_{l-y}P_y$ on GaAs with a Group V to Group III ratio of about 2:1. Data was collected under variable input gas flow conditions with the normalized flow ratio given by $f_P/(f_{As}+f_P)$. HRXRD was used to determine y via a double crystal scattering geometry, in which $CuK_α$ radiation was monochromatorized with a Ge crystal set to the reflection having Miller indices (4,0,0).

Figure 2:
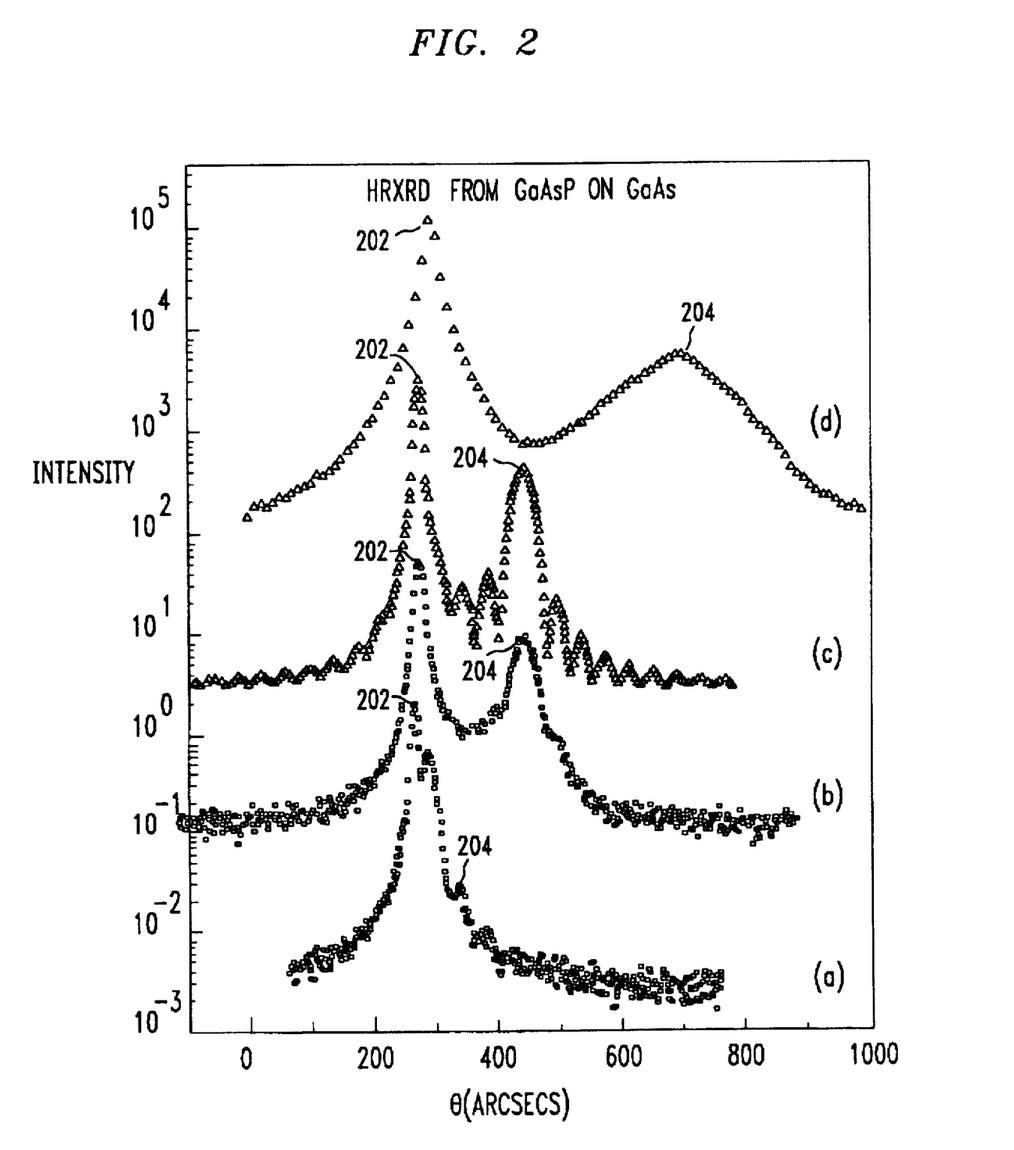
FIG. 2 shows High Resolution X-Ray diffraction (HRXRD) from GaAsP on GaAs.

HRXRD scans about the (4,0,0) reflection are shown at traces (a), (b), (c) and (d) in FIG. 2 for $PH_3$ flows of 0.13, 0.34 and 0.52 sccm, respectively, at a fixed $AsH_3$ flow of 2.5 sccm. Each trace (a), (b), (c) and (d) in FIG. 2 consists of a sharp reflection from the GaAs substrate (left), as shown at 202, and weaker ternary alloy reflection shifted right, as shown at 204.

The separation in diffraction angle between reflections increases with normalized P flux ratio owing to the smaller lattice constant of $GaAs_{l-y}P_y$ for increasing y. For increasing $PH_3$ flow the (4,0,0) diffraction width of the ternary alloy increases while the amplitude of pendellösung fringes (i.e., the imposed periodic modulation) are reduced. Both effects are caused by the progressively thinner ternary layer needed to avoid the critical thickness limit. (See Crystal Growth, supra.) In fact, model simulations based on dynamical scattering give a ternary full width half maximum of 100 arcsecs for trace (d), which compares to the measured width of 120 arcsec. Commercially available simulation packages are available for such measurements.

The inventors have corrected for Bragg's law because of dynamical scattering in the thin layer thickness. (See P. F. Fewster and C. J. Curling, J. Appl. Phys., 62, 4154, 1987.) Model dynamical scattering simulations for the case of trace (b) are shown in trace (c). Simulated trace (e) indicates that the correction for Bragg's law is small (e.g., about 1%). Nevertheless, the detailed reproduction of trace (b) by dynamical scattering simulations does provide the first demonstration that control of composition for anion alloys, despite incorporation nonlinearities, is equal to the control of composition for the cation.

To measure higher P content alloys the inventors employed chemical profiling using Secondary Ion Mass Spectrometry (SIMS). They investigated a layer structure comprising five variable y, $GaAs_{x-y}P_y$, layers, each layer being 500 Å thick. The five $GaAs_{l-y}P_y$ layers were embedded in a GaAs matrix using growth conditions similar to those described above for the P incorporation into $GaAs_{l-y}P_y$. SIMS was accomplished with an $O_2$ beam accelerated to 4 keV. Singly ionized AsO and PO species were detected and their output signals were plotted versus depth at traces (a) and (b) in FIG. 3, respectively. The corresponding Group V gas flows are provide at the bottom FIG. 3. As clearly shown at trace (b), the PO signal, and hence P content in the ternary, increases proportionately with $PH_3$ flow.

Figure 3:
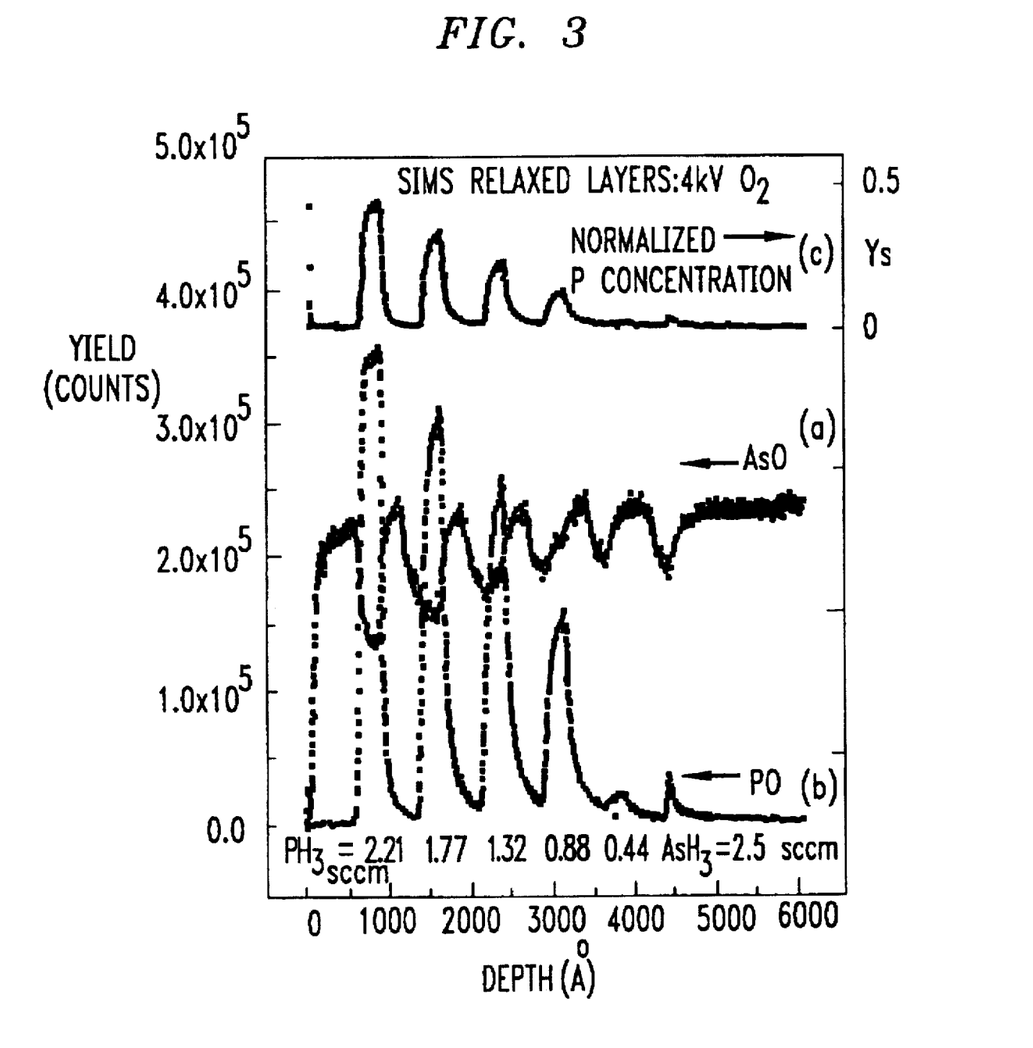
FIG. 3 shows Secondary Ion Mass Spectrometry (SIMS) from GaAsP alloys on GaAs.

However, determining absolute y from SIMS is problematic because of the differing probability of PO and AsO yield per sputtering event. In this case, the inventors treated the differing yield as a variable, σ. A trace (c) in FIG. 3 shows a plot of the function: $y_z$=PO/(PO+σAsO). Here, AsO and PO are the ordinates of traces (a) and (b). The inventors determined σ to be 2.9 by forcing $y_z$ to have the composition that was obtained under identical flow where HRXRD data was evaluated. With the exception of the lowest P flow condition in FIG. 3, the ternary layers exceed the critical layer thickness by a considerable margin. Therefore, the SIMS data corresponded to the case of incorporation on relaxed GaAsP.

Figure 4:
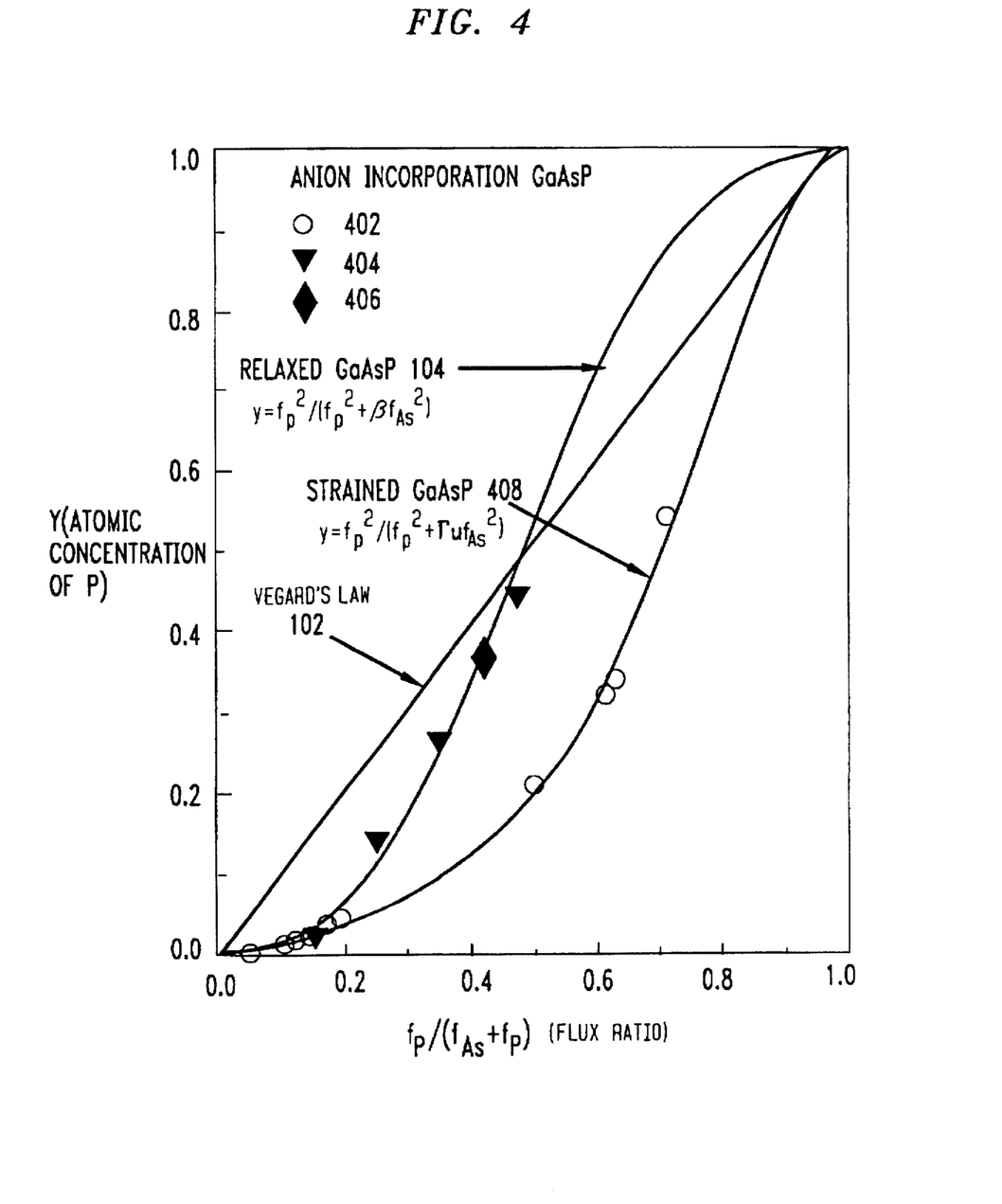
FIG. 4 shows dependence of anion incorporation into GaAsP.

FIG. 4 shows y (atomic concentration of P) plotted versus normalized gas flow ratio, which define P incorporation into $GaAs_{1-y}P_y$. Three sets of data points yield consistent alloy compositions for the relaxed curve 102 and a strained curve 408. The HRXRD data points 402 are shown as circles, the SIMS data points 404 are shown as solid inverted triangles and the PL data points 406 are shown as solid diamonds. For the first time incorporation has been measured over a wide range of input flow variables (abscissa) and the behavior at the origin has been completely identified. The data show that for low $PH_3$ flow, P content increases quadratically from the origin with As preferred over P. For higher $PH_3$ flow, a more linear dependence occurs with As and P incorporation about equal.

Even though incident anions species are monomers, and desorption is thermally suppressed, the Group V incorporation characteristics still depart from the linear relationship found for the Group III's (Vegard's law). The initial quadratic dependence also differs from the parabolic dependence found during Metalorganic Chemical Vapor Deposition (MCVD). The MCVD results indicate that $As_2$ and $P_2$ formation in the gas phase boundary layer compete with solid state incorporation. (See G. B. Stringfellow, *J. Electron. Mater.*, 17, 67, 1983.)

The process of Group V incorporation changes when $GaAs_{1-y}P_y$ is used to strain balance InGaAs on GaAs to make MQW modulators. In practice, the difference is large and unpredictable to the extent that precise strain balancing cannot be obtained in advance.

Figures 5, 5A:
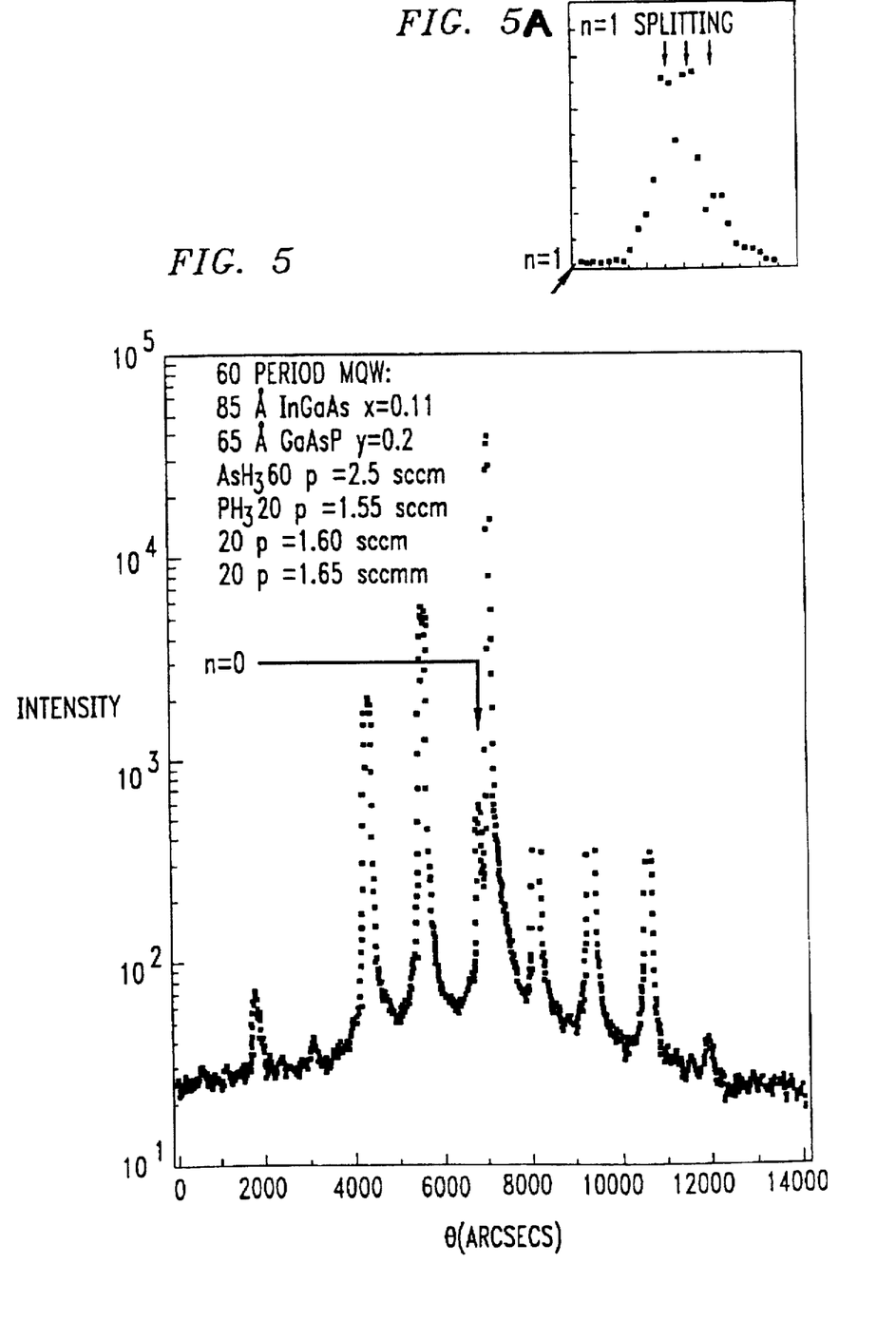
FIG. 5 shows HRXRD from strain balance multiple quantum well (MQW) modulators.
FIG. 5A shows a blowup of the n=+1 satellite.

FIG. 5 shows HRXRD from a strain balanced MQW containing an x of 0.11. After several attempts at balancing with different y, conditions can be found where both morphological cross hatching (strain relief) and 2D–3D growth mode changes do not occur. Nevertheless, HRXRD shows that balancing is not complete since the fundamental satellite of the superlattice lies to the left of the GaAs substrate reflection by 300 arcsec. Its exact position, however, does provide an accurate measure of Group V incorporation, y.

Strain balanced MQW, when measured with HRXRD, also permits measurement of the slope in the incorporation characteristics. This measurement is accomplished using $GaAs_{1-y\pm\delta}P_{y\pm\delta}$ barriers containing small Group V perturbations (δ) at fixed x. FIG. 5A shows such an example. P incorporation in strain balanced MQW is suppressed in comparison to relaxed surfaces. Furthermore, strain has induced more nonlinearity in the incorporation characteristics. The incorporation characteristics observed by the inventors for strain balanced superlattices are unexpectedly similar to results for non-pseudomorphic superlattices on GaAs that has been reported using growth conditions differing with that of the inventors. (See H. Q. Hou, B. W. Laing, T. P. Chin and C. W. Tu, *Appl. Phys. Lett.*, 59, 292, 1991.) Indeed, this is accidental since the inventors find non-pseudomorphic superlattices on GaAs, when grown under our conditions, have incorporation characteristics lying between the two limits of surface conditions: relaxed or strain balanced.

The inventors also considered the role played by surface dimerization of Group V species as a physical basis to model Group V incorporation. The process of dimerization provides an immediate explanation of why Group III and Group V incorporation behavior differ. Under typical growth conditions anions dimerize on the surface, whereas cations do not. The absence of Group III species dimerization leads to cation incorporation, which is linearly dependent on input variables as Vegard's law predicts. Contrastingly, for Group V incorporation the probability that a given species dimerizes on the surface is proportional to the frequency of occurrence of nearest neighbor pairs. The pair probability, and hence what is termed the dimer number, increases proportionately with the square of incident flux.

In conclusion, the inventors' have found nonlinear anion incorporation into GaAsP that vary systematically with the lattice as it changes from relaxed to elastically strained. They have also accurately modeled their characteristics with an anion dimerization function that enhances As incorporation probability when the bond length of the dimer and lattice is coincident.

While various embodiments of the present invention have been described above, it should be understood that they have been presented by way of example, and not limitation. It will be apparent to persons skilled in the relevant art that various changes in form and detail may be made therein without departing from the spirit and scope of the invention. The present invention should not be limited by any of the above-described exemplary embodiments, but should be defined only in accordance with the following claims and their equivalents. All cited patent documents and publications in the above description are incorporated herein by reference.

What is claimed is:

1. A method of producing a nonstrained semiconductor alloy composition ($c_A$) from input variables A and B under non-linear incorporation conditions, comprising the steps of:

selecting a bandgap for the alloy;

determining a composition for the alloy based on said bandgap;

determining a value for a fitting parameter β, where β skews incorporation of an input flux $f_B$ due to surface populations of dimer species for a periodic Group of the input variable B;

determining an input flux $f_A$ and said input flux $f_B$ for the input variables A and B, respectively; and growing the alloy which follows non-linear incorporation to achieve said composition using said determined input fluxes $f_A$ and $f_B$;

wherein said input fluxes are determined by their second-order relationship to said composition as a function of a normalized input flux ratio, $f_A/(f_B+f_A)$, according to a relationship $c_A = f_A^2/(f_A^2 + \beta f_B^2)$.

2. The method of claim 1, wherein said step of determining a value for a parameter β comprises the steps of:

growing an alloy according to a relationship of $c_A = f_A/(f_A+f_B)$;

performing initial scattering measurements on said alloy to obtain data points;

performing a curve fitting analysis of said data points to obtain a curve, wherein said curve determines the value of β for said alloy.

3. The method according to claim 1, wherein said step of selecting comprises selecting said bandgap such that the alloy can operate at a specific wavelength.

4. The method according to claim 1, wherein said second-order relationship is modified by a weighted combination of said second-order relationship and Vegard's law, according to an expression:

$$c_A = a(f_A^2/(f_A^2+\beta f_B^2)) + b(f_A/(f_B+f_A))$$

where a and b are positive, non-zero weighting coefficients and $\beta$ is not equal to $f_A/f_B$.

5. A method of producing a non-strained $GaAs_{1-y}P_y$ alloy composition under non-linear incorporation conditions, comprising the steps of:

selecting a bandgap for the alloy;

determining a composition for the alloy based on said bandgap;

determining a value for a fitting parameter $\beta$, where $\beta$ skews incorporation of an input flux $f_{As}$ due to surface populations of dimer species for a periodic Group of the input variable As;

determining an input flux $f_P$ and said input flux $f_{As}$ for the input variables P and As, respectively; and growing the alloy which follows non-linear incorporation to achieve said composition using said determined input fluxes $f_P$ and $f_{As}$;

wherein said input fluxes are determined by their second-order relationship to said composition as a function of a normalized input flux ratio, $f_P/(f_{As}+f_P)$, according to a relationship $y = f_P^2/(f_P^2+\beta f_{As}^2)$.

6. The method of claim 5, further comprising the steps of: determining $\beta$, wherein $\beta$ is determined by growing an alloy according to a relationship of $y = f_P/(f_P+f_{As})$;

performing initial scattering measurements on said alloy to obtain data points;

performing a curve fitting analysis of said data points to obtain a curve, wherein said curve determines the value of $\beta$ for said alloy.

7. The method of claim 5, further comprising the step of setting $\beta = 0.85$.

8. The method according to claim 5, wherein said step of growing comprises using one of the following processes: Liquid Phase Epitaxy, Vapor Phase Epitaxy, Molecular Beam Epitaxy, Gas Source Molecular Beam Epitaxy, Chemical Beam Epitaxy, Chemical Vapor Deposition, and Metalorganic Chemical Vapor Deposition.

9. A method of producing a strained semiconductor alloy composition ($c_A$) from input variables A and B under non-linear incorporation conditions, comprising the steps of:

selecting a bandgap for the alloy;

determining a composition for the alloy based on said bandgap;

determining a value for a fitting parameter $\Gamma$, where $\Gamma$ skews incorporation of an input flux $f_B$ due to strain dependence incorporation;

determining an input flux $f_A$ and said input flux $f_B$ for the input variables A and B, respectively; and growing the alloy which follows non-linear incorporation to achieve said composition using said determined input fluxes $f_A$ and $f_B$;

wherein said input fluxes are determined by their second-order relationship to said composition as a function of a normalized input flux ratio, $f_A/(f_B+f_A)$, according to a relationship $c_A = f_A^2/(f_A^2+\Gamma f_A f_B^2/(f_A+f_B))$.

10. The method of claim 9, wherein said determining a value for a parameter $\Gamma$ comprises the steps of:

growing an alloy according to a relationship of $c_A = f_A(f_A+f_B)$;

performing initial scattering measurements on said alloy to obtain data points;

performing a curve fitting analysis of said data points to obtain a curve, wherein said curve determines the value of $\Gamma$ for said alloy.

11. The method according to claim 9, wherein said second-order relationship is modified by a weighted combination of said second-order relationship and Vegard's law, according to an expression:

$$c_A = a(f_A^2/(f_A^2+\Gamma F_A f_B^2/(f_A+f_B))) + b(f_A/(f_B+f_A))$$

where a and b are positive, non-zero weighting coefficients.

12. The method according to claim 4, wherein said alloy composition is $InAs_{1-y}P_y$.

* * * * *